United States Patent [19]
Steger et al.

[11] Patent Number: 5,644,467
[45] Date of Patent: Jul. 1, 1997

[54] METHOD AND STRUCTURE FOR IMPROVING GAS BREAKDOWN RESISTANCE AND REDUCING THE POTENTIAL OF ARCING IN A ELECTROSTATIC CHUCK

[75] Inventors: Robert J. Steger, Cupertino; Brian Lue, Mountain View, both of Calif.

[73] Assignee: Applied Materials, Inc., Santa Clara, Calif.

[21] Appl. No.: 535,422

[22] Filed: Sep. 28, 1995

[51] Int. Cl.$^6$ .................................................. H02N 13/00
[52] U.S. Cl. .................................................. 361/234
[58] Field of Search .................................. 361/234, 233; 269/8, 903; 279/128

[56] References Cited

U.S. PATENT DOCUMENTS

| | | | |
|---|---|---|---|
| 5,270,266 | 12/1993 | Hirano et al. | 437/228 |
| 5,315,473 | 5/1994 | Collins et al. | 361/234 |
| 5,350,479 | 9/1994 | Collins et al. | 156/345 |
| 5,515,167 | 5/1996 | Ledger et al. | 356/357 |
| 5,542,559 | 8/1996 | Kawakami et al. | 216/67 |

FOREIGN PATENT DOCUMENTS

| | | | |
|---|---|---|---|
| 93309608 | 6/1994 | European Pat. Off. | C23C 14/50 |

OTHER PUBLICATIONS

U.S. application No. 08/372,177, filed Jan. 12, 1995.

*Primary Examiner*—Fritz Fleming
*Attorney, Agent, or Firm*—Shirley L. Church

[57] ABSTRACT

The present invention discloses a basic structure and a method for fabrication of the structure which facilitates the flow of cooling gas or other heat transfer fluid to the surface of an electrostatic chuck. The basic structure addresses the problem of the rf plasma environment which seeks the interface between the electrostatic chuck dielectric surface layer and its underlying conductive layer. The basic structure includes an underlying conductive layer which contains at least one gas flow passageway and at least one dielectric layer overlying said conductive layer. The dielectric layer forms the upper surface of the dielectric chuck and contains at least one opening or passageway which connects with the fluid flow passageway in the conductive layer. The dielectric layer thickness is greater in the area of the opening or passageway than at other locations on the surface of the dielectric chuck. The basic structure provides an insulative dielectric structure as the upper surface of the electrostatic chuck and improves the isolation of the electrostatic chuck dielectric surface from the underlying conductive layer. Typically, the conductive layer is an aluminum pedestal and the overlaying dielectric layer is a spray-applied alumina. Other materials of construction can be used so long as they meet electrical requirements and their relative thermal coefficients of expansion do not create problems in the integrity of the electrostatic chuck after multiple cycles in the intended processing environment.

23 Claims, 5 Drawing Sheets

METHOD AND STRUCTURE FOR IMPROVING GAS BREAKDOWN RESISTANCE AND REDUCING THE POTENTIAL OF ARCING IN A ELECTROSTATIC CHUCK

BACKGROUND OF THE INVENTION

1. Field of the Invention

The present invention pertains to an electrostatic chuck structure which provides for the flow of heat transfer fluids to the surface of an electrostatic chuck. The structure comprises a conductive underlayer which contains a gas flow channel and an overlying layer of dielectric material. The structure is useful in preventing the breakdown of a heat transfer fluid fed through the electrostatic chuck to its surface to cool the bottom surface of a work piece such as a silicon wafer which resides upon the electrostatic chuck. The structure is also useful in preventing the penetration of semiconductor processing plasma into the heat transfer fluid openings in the electrostatic chuck.

2. Brief Description of the Background Art

U.S. Pat. No. 5,350,479 to Collins et al. issued Sep. 27, 1994, and hereby incorporated by reference, describes an electrostatic chuck for holding an article to be processed in a plasma reaction chamber. The electrostatic chuck includes a metal pedestal coated with a layer of dielectric material which contains a cooling gas distribution system for passing and distributing a cooling gas between the upper surface of the electrostatic chuck and an article supported on that surface. The gas distribution system includes a plurality of intersecting grooves formed entirely in the upper surface of the electrostatic chuck, with small gas distribution holes through intersections of the grooves.

The lifetime of an electrostatic chuck is affected by the presence of the gas distribution holes used to facilitate the heat transfer gas. In particular, when the electrostatic chuck is subjected to high power rf fields and high density plasmas immediately above the work piece, it is possible to have breakdown of the cooling gas due to arcing or glow discharge. Further, since there is a line of sight path between the article (typically a semiconductor substrate) supported on the upper, dielectric surface of the electrostatic chuck and the underlying conductive layer (such as aluminum) which forms the pedestal of the electrostatic chuck, arcing can occur along this path despite the fact that the gas distribution holes may be sized to minimize discontinuities in the electric field which can lead to breakdown of the cooling gas passing through the holes. Arcing or glow discharge at the surface of the semiconductor substrate can result in loss of the substrate. Arcing or glow discharge within the gas distribution holes deteriorates the dielectric layer and underlying aluminum layer of the electrostatic chuck itself.

Collins et al. recommends that the aluminum layer beneath the dielectric layer be cut back (away) beneath the dielectric layer immediately adjacent the gas distribution hole to reduce the possibility of arcing across the line of sight path from the semiconductor substrate to the aluminum layer.

U.S. Pat. No. 5,315,473 to Collins et al., issued May 24, 1994, and hereby incorporated by reference, describes methods of improving the clamping force of the electrostatic chuck among other features. In particular the composition of the dielectric material and the thickness of the dielectric layer are among the critical factors. Generally, the thinner the dielectric layer, the greater the clamping force, all other factors held constant. However, there are practical limitations which limit the reduction of thickness of the dielectric layer. For dielectric layers approximately 1 mil or less in thickness, it has been found that the dielectric material breaks down and loses its insulating properties at voltages required to overcome air gaps between the article being processed and the underlying platform.

European Patent Application No. 93309608.3 of Collins et al., published Jun. 14, 1994, and hereby incorporated by reference, describes the construction of an electrostatic chuck of the kind disclosed in U.S. Pat. No. 5,350,497 referenced above. The electrostatic chuck fabrication includes bead blasting of the aluminum pedestal, followed by spraying (e.g. plasma-spraying of a dielectric material such as alumina or alumina/titania) upon the bead-blasted surface. Typically the sprayed thickness is greater than the final desired thickness, e.g. 15–20 mils (380–508 microns). After the dielectric material has been applied, it is ground back to a layer having a desired final thickness, for example, 7 mils (180 microns). The upper surface of the dielectric layer is then processed to provide a pattern of cooling gas distribution grooves over the surface of the layer and perforations through the dielectric layer which connect with cooling gas distribution cavities within the underlying aluminum pedestal. In some instances, the gas distribution cavities within the underlying aluminum pedestal are prepared in advance of application of the dielectric layer, and in other instances, the gas distribution cavities in the aluminum pedestal are prepared simultaneously with the perforations through the dielectric layer. Typically, the cooling gas distribution grooves are produced using a laser. The perforations through the dielectric layer are prepared by drilling using a mechanical drill or a laser. A preferred laser for drilling is an excimer UV laser (i.e. a short wave-length, high energy laser) run at a relatively low time averaged power level. This helps reduce the redepositing of drilled aluminum from the underlying thin layer onto the walls of the perforations and onto the surface of the dielectric. Presence of such aluminum can cause arcing across the dielectric layer. The perforations are frequently placed around the outer perimeter of the surface of the electrostatic chuck. For an 8 inch silicon wafer electrostatic chuck, there are about 180 such perforations which form a ring-like structure around the outer perimeter of the electrostatic chuck. Each perforation has a diameter which is approximately 0.007±0.001 inch (0.175±0.025 mm).

While micro-drilling through the composite dielectric layer overlaying the aluminum pedestal to provide the perforations described above provides a satisfactory gas passage, it fails to address the rf plasma environment that seeks the interface between the dielectric alumina coating and the aluminum substrate. Moreover, the laser drilling process ablates the aluminum beneath the dielectric layer as drilling proceeds and this ablate condenses or deposits in the bore, thus coating ceramic surfaces of the bore. Due to this mechanism, at least the lower portion of the hole may become a metallic conductor (aluminum) despite the use of a high aspect ratio (depth/diameter) for the gas passage. The removal of the machined micro chips slurry from the distribution hole is a difficult task, and is compounded by any migration of aluminum particles up through the dielectric gas distribution hole during drilling. Presence of machined micro chips slurry is a source of contaminant in the micro electronic environment.

SUMMARY OF THE INVENTION

The present invention discloses a basic structure and a preferred method for fabrication of the structure which facilitates the flow of cooling gas or other heat transfer fluid to the surface of an electrostatic chuck. The basic structure addresses the problem of the rf plasma environment which seeks the interface between the electrostatic chuck dielectric surface layer and its underlying conductive layer.

The basic fluid flow conduit structure includes an underlying conductive layer which contains at least one fluid (typically gas) flow passageway, and at least one overlying dielectric layer which contains at least one opening or passageway through the dielectric layer which connects with the fluid flow passageway in the underlying conductive layer, to provide a fluid flow passageway through the entire structure. The configuration of the underlying conductive layer is such that the thickness of the dielectric layer is substantially increased in the area of the opening or passageway through the dielectric layer to the underlying conductive layer gas flow passageway (in comparison to the thickness of the dielectric layer overlying surface areas of the electrostatic chuck which do not contain gas flow passageways).

A preferred method of forming the basic structure is as follows: at least one conductive layer containing a fluid flow passageway is provided; at least one groove or depression is created in the surface of the conductive layer, the groove or depression overlying the fluid flow passageway; a layer of dielectric material is applied over the surface of the conductive layer; the dielectric material layer is processed if necessary to provide a level (flat), smooth surface over the entire upper surface of the electrostatic chuck; and an opening or passageway is created in the dielectric layer to connect with the fluid flow passageway in the underlying conductive layer.

Typically, the conductive layer is an aluminum pedestal of an electrostatic chuck, and the overlying dielectric layer is applied by spray coating alumina or alumina/titania over the surface of the aluminum pedestal. However, other materials of construction can be used so long as they meet electrical requirements and the relative thermal coefficients of expansion do not create problems in the integrity of the electrostatic chuck after multiple cycles in the intended plasma processing environment. For example, preferred materials for use as the conductive layer include copper, brass, molybdenum, and niobium in addition to aluminum; and, preferred materials for use as the overlying dielectric layer include polyimides as well as ceramics of the kind previously mentioned.

DETAILED DESCRIPTION OF THE PREFERRED EMBODIMENTS

The present invention pertains to a basic structure, and to methods for forming a structure which provides for cooling gas distribution to the surface of an electrostatic chuck. The basic structure addresses the problem of the rf plasma environment which seeks the interface between the electrostatic chuck dielectric surface layer and the underlying conductive layer. In particular, the present invention relates to an improvement in the structural configuration of the conductive underlayer containing the heat transfer fluid distribution channel in combination with the overlying dielectric layer which includes an opening leading to and connected with the heat transfer (cooling) fluid distribution channel. The present improvement significantly reduces the possibility of breakdown of the cooling gas due to arcing or glow discharge between the surface of the electrostatic chuck and the work piece. Thus, the working lifetime of the electrostatic chuck is extended while the probability of loss of a semiconductor substrate due to glow arcing is reduced.

Figure 1:
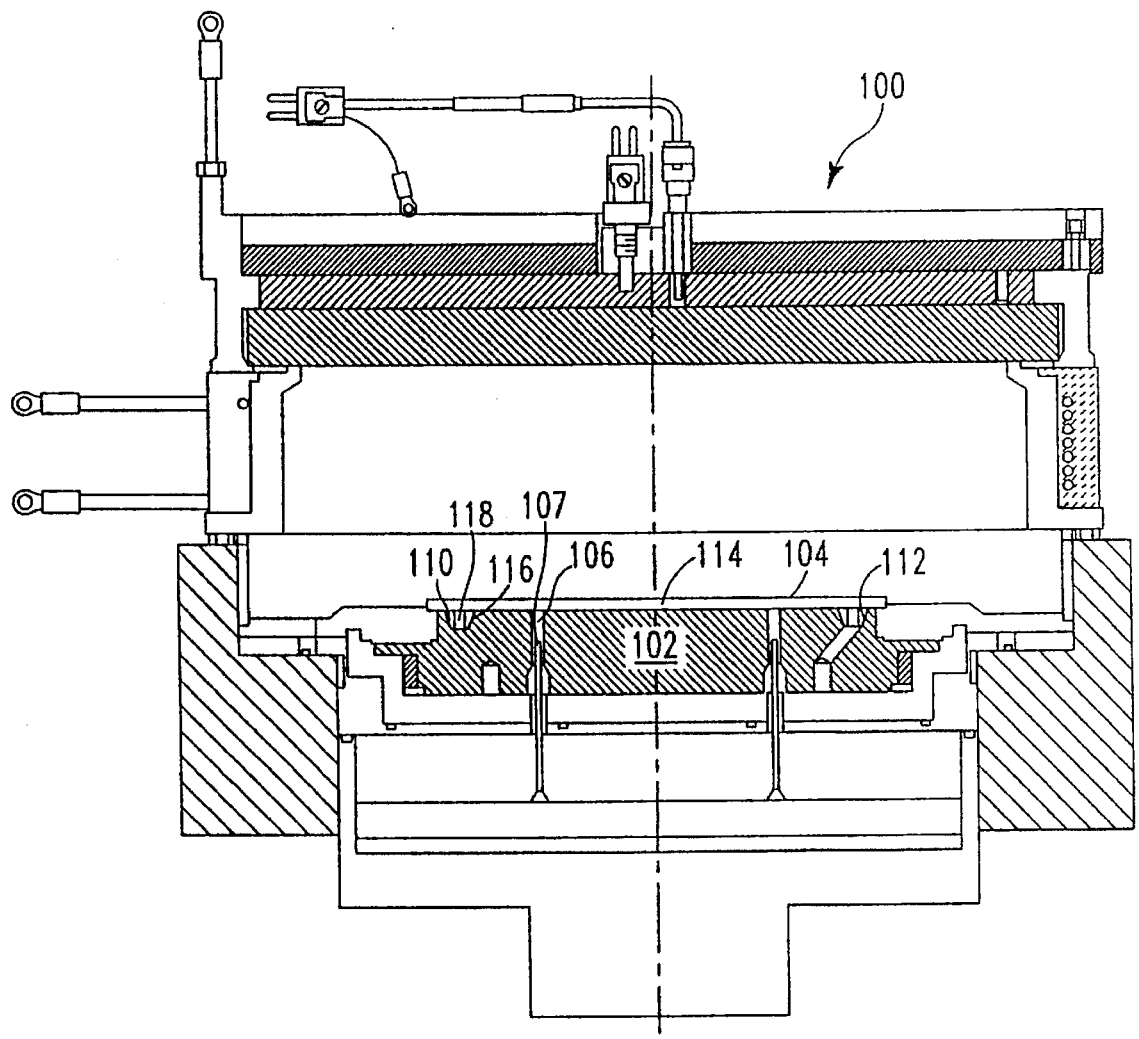
FIG. 1 illustrates a typical plasma etch processing chamber with an electrostatic chuck in place within the chamber.
Figure 2A:
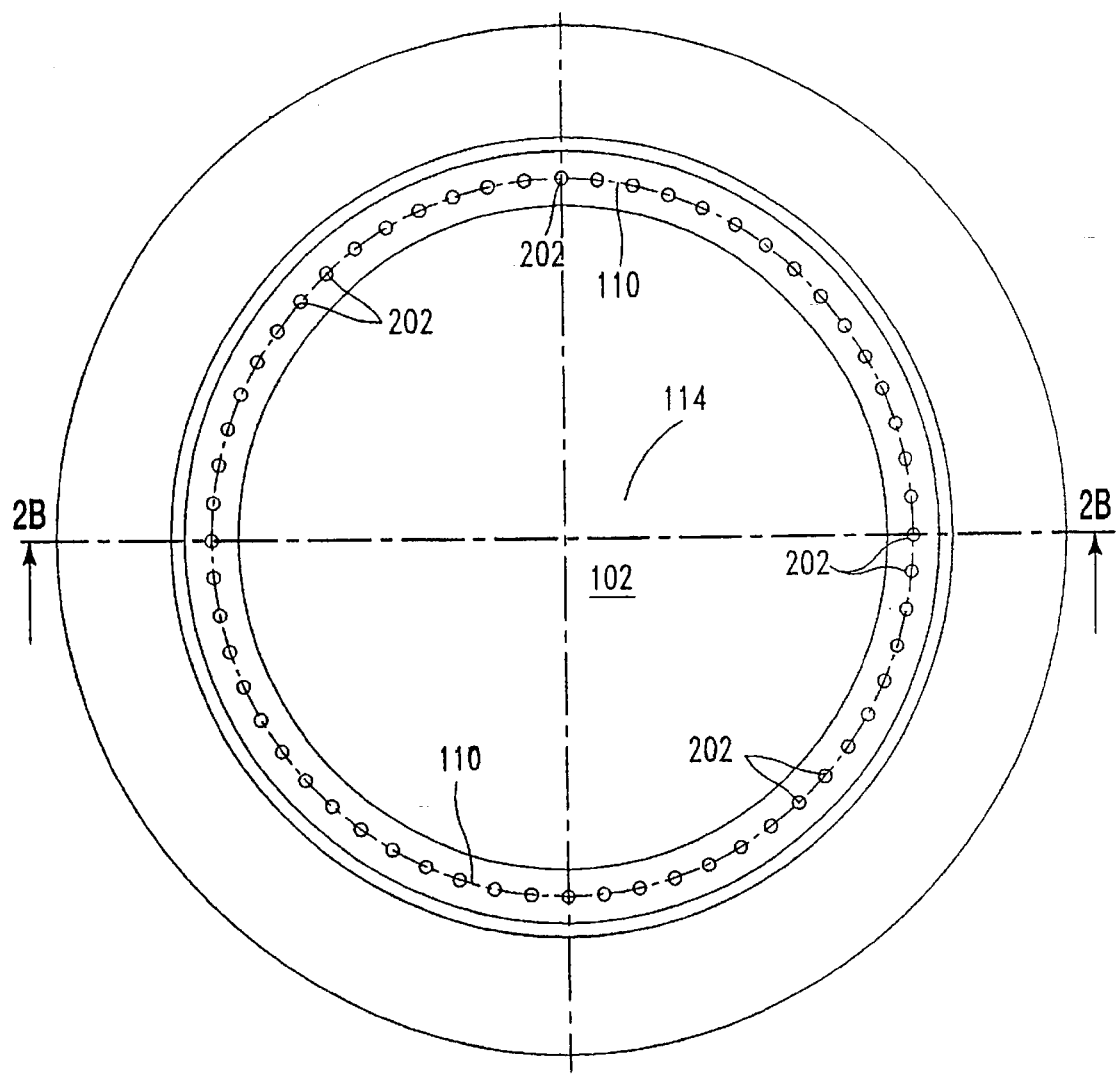
FIG. 2A shows a schematic of a typical electrostatic chuck, including gas distribution holes or perforations arranged around the peripheral edge of the electrostatic chuck.
Figure 2B:
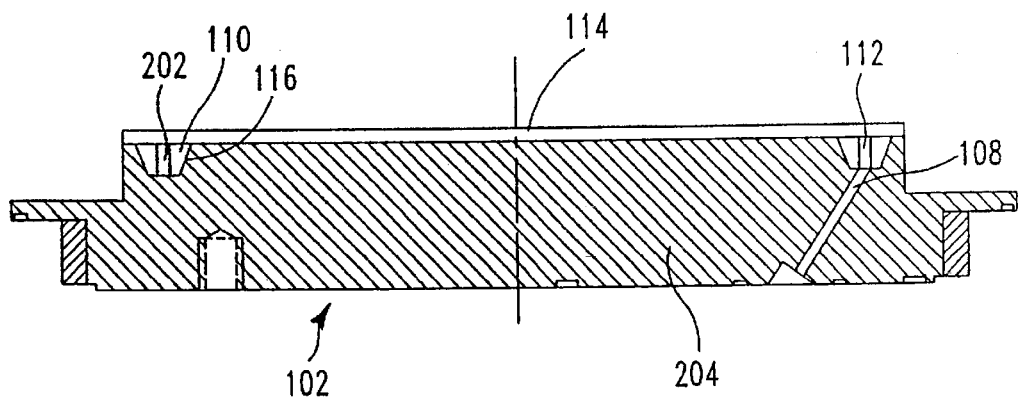
FIG. 2B shows a schematic of a cross-sectional view of the electrostatic chuck of FIG. 2A, including a conductive insert which contains fluid flow passageways for cooling gas.

With reference to FIG. 1, plasma processing chamber 100 contains electrostatic chuck 102 which electrostatically clamps work piece 104 (typically a semiconductor wafer) in position within chamber 100 during processing. Electrostatic chuck 102 comprises lift finger openings 106 which contain lift fingers 107 which enable lifting the semiconductor wafer off the upper surface of electrostatic chuck 102 once the power has been turned off and the clamping force terminated. Electrostatic chuck 102 also includes at an annular metallic insert 110 near the periphery of electrostatic chuck 102 which sits inside a channel 116 machined into the surface of pedestal 204 of electrostatic chuck 102. Insert 110 works in cooperation with channel 116 in the surface of pedestal 204 (See FIG. 2B) to provide a gas flow channel 112 around the entire periphery of electrostatic chuck 102, as shown in FIG. 2A. Gas flow channel 112 traverses annular metallic insert 110 from its base to within close proximity of its upper surface, leaving a thin layer of metal 118 (shown in FIG. 3A) separating dielectric layer 114 from gas flow channel 112.

With reference to FIG. 2A, which shows a top view of electrostatic chuck 102, the upper surface of electrostatic chuck 102 is covered with a dielectric layer 114. To enable the flow of a cooling gas through flow channel 112 to the upper surface of electrostatic chuck 102, it is necessary to create an opening or passageway 202 through overlying dielectric layer 114 and thin metal layer 118.

Figure 3A:
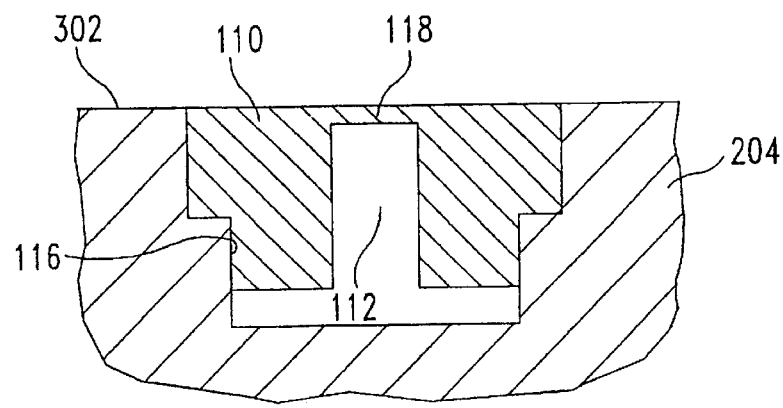
FIG. 3A shows a schematic of an enlargement of the cross-sectional view of a portion of the flow passageway for cooling gas, as illustrated in FIG. 2B, absent the overlying dielectric layer and absent a passageway through the dielectric layer and underlying thin metal layer to the gas channel which underlies the thin metal layer.

An enlarged schematic of the cross-sectional view of gas flow channel 112 within electrostatic chuck 102 is shown in FIG. 3A, without overlying dielectric layer 114 and without passageway 202. Gas flow channel 112 can be formed using welding or brazing of insert 110 into pedestal 204, as known in the art. After dielectric layer 114 (not shown) is applied over the surface 302 of electrostatic chuck pedestal 204, it is necessary to create passageway 202 shown in FIGS. 2A and 2B. As described in the Background Art section of the present specification, with reference to European Patent Application No. 93309608.3 of Collins et al., it is recommended that such passageways be created using an excimer UV laser, although the passageways may also be created by mechanical drilling.

It has been discovered that during creation of passageway 202, it is not uncommon for the metallic material (typically aluminum) of thin layer 118 to flow up the sidewalls of passageway 202 as it is formed through dielectric layer 114. Presence of this conductive layer on the sidewalls of passageway 202 creates a path for arcing between the surface of pedestal 202 of electrostatic chuck 102 and an overlying work piece 104. Further, in the event adherence of overlying work piece 104 to the surface of the chuck 102 becomes weak at any point, process plasma can work its way under the surface of work piece 104, and cooling gas flow passageways begin to glow, causing a low impedance path for rf current from the work piece 104 to electrostatic chuck 102 which is both High Voltage DC biased and fed with rf power. Normally the rf current is a displacement current through the dielectric layer 114 from the pedestal 204 of electrostatic chuck 102 to the work piece 104. However, when a cooling gas such as helium begins to break down within passageways 202 and a glow conduction path is created, large currents are drawn around passageways 202. Molten dielectric material within dielectric layer 114 has been observed after such occurrences. Since electrostatic chucks cost on the order of $5,000 to $10,000, and the value of the work piece is typically as much as four times greater, the loss of an electrostatic chuck or a work piece during processing has significant economic impact.

If the thickness of dielectric layer 114 is increased to improve the impedance within passageways 202, this results in a decrease in clamping force of the electrostatic chuck. An increase in the High Voltage DC current to offset a thickness increase in dielectric layer 114 results in an increased likelihood of cooling gas breakdown in passageways 202.

To overcome the problem described in the preceding paragraph, the present invention provides a new configuration for the dielectric layer which provides increased thickness in dielectric layer 114 in the immediate area of pathway 202 while maintaining the standard thickness over the remaining surface areas of electrostatic chuck 102. Further, the overall flat surface required for electrostatic chuck 102 is maintained. As a general rule, the variation in the flatness of the surface of electrostatic chuck 102 should be no more than the variation of feature height upon the surface of the work piece 104. Typically this requires the electrostatic chuck surface to be flat within at least 1.0 mil (0.025 mm). Flatness of 1.0 mil is interpreted to mean that all points on the surface lie within two parallel planes spaced 0.001 inch (0.025 mm) apart. Preferably flatness is within a few (about 2–5) microns (about 0.1 mil–0.2 mil).)

Figure 3B:
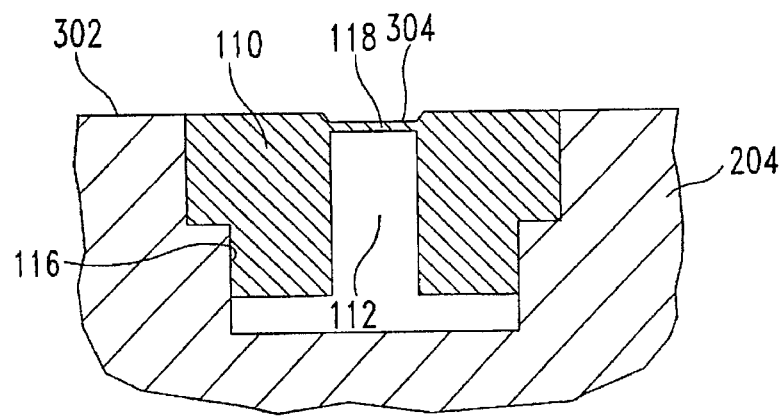
FIG. 3B shows a schematic of a the cross-sectional view shown in FIG. 3A after creation of a groove or depression in the surface of the cooling gas passageway insert, the depression overlying the cooling gas passageway.
Figure 3C:
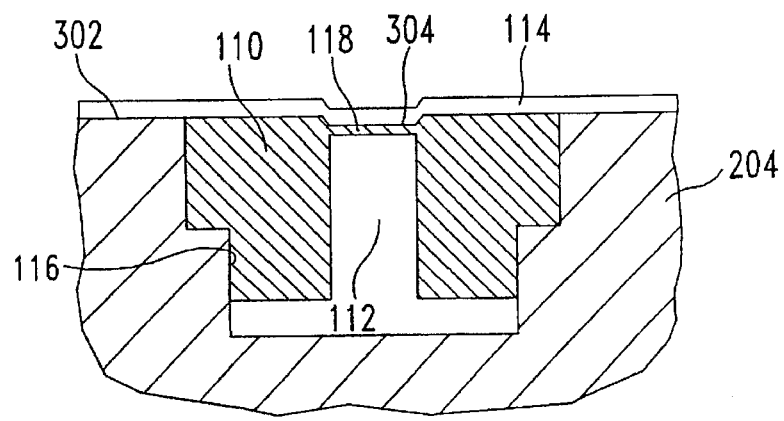
FIG. 3C shows a schematic of the cross-sectional view shown in FIG. 3B, after application of a layer of dielectric material over the surface of the electrostatic chuck, including the groove or depression previously described.

FIG. 3B shows the schematic of metallic pedestal 204 of electrostatic chuck 102, as shown in FIG. 3A, after creation of an annular groove or depression 304 within thin metallic layer 118. The shape of groove or depression 304 is not known to be critical, and the embodiment shown is merely illustrative of the present invention. The preferred thickness of metallic layer 118 underlying groove or depression 304 is less than about 50 mils (1.3 mm), and more preferably ranges from about 5 mils (0.13 mm) to about 50 mils (1.3 mm), with the most preferable thickness range being from about 12 mils (0.30 mm) to about 25 mils (0.63 mm). The presence of groove or depression 304 makes possible an increased thickness of dielectric layer 114 in the area through which passageway 202 is created. FIG. 3C shows a schematic of the cross-sectional view of metallic pedestal 204 having dielectric layer 114 applied over its surface 302.

Figure 3D:
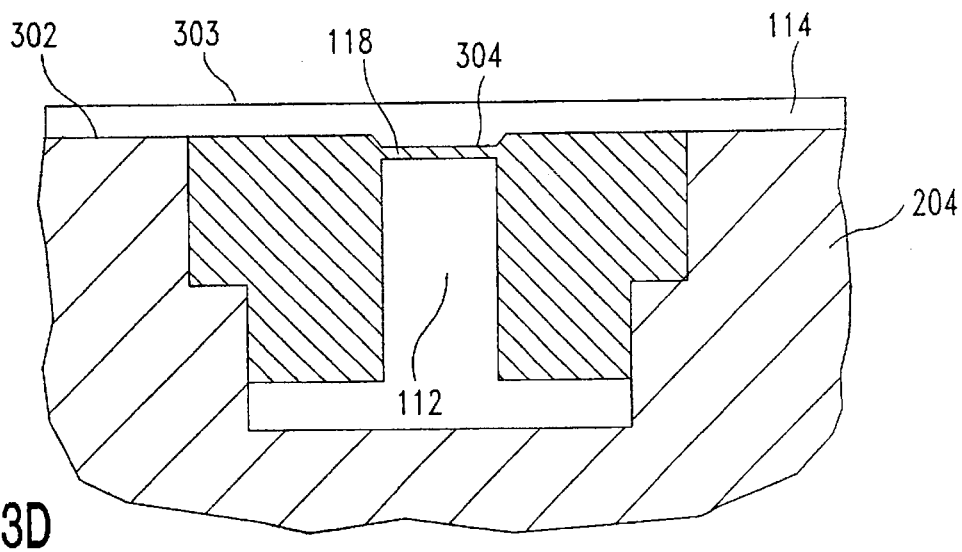
FIG. 3D shows a schematic of the cross-sectional view shown in FIG. 3C, after processing of the layer of dielectric material to provide a smooth, flat electrostatic chuck upper surface.
Figure 3E:
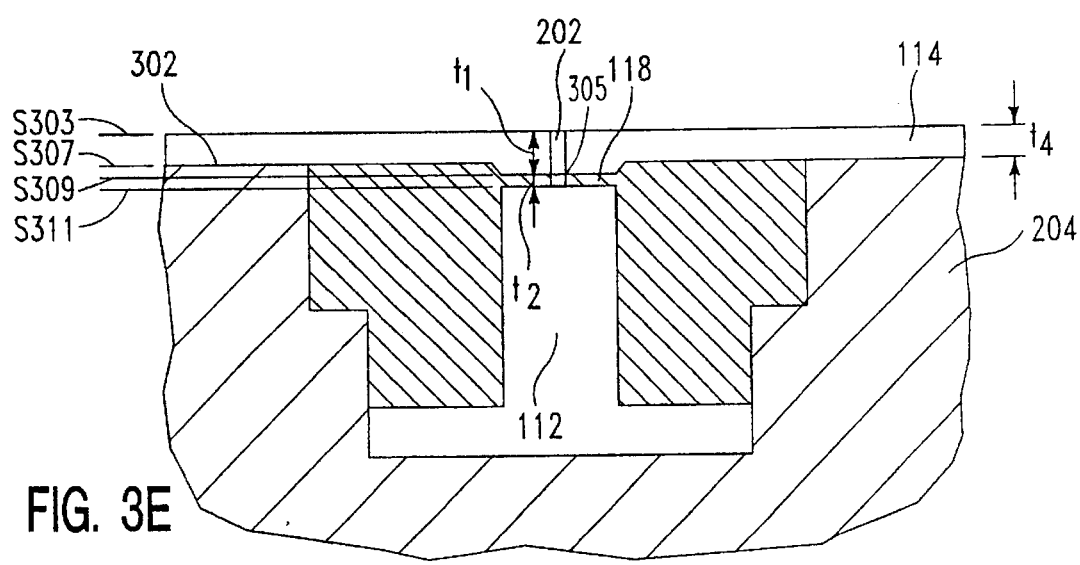
FIG. 3E shows a schematic of the cross-sectional view shown in FIG. 3D after formation of a passageway through both the overlying layer of dielectric material and underlying layer of conductive material, to provide a gas flow passageway from the upper surface of the dielectric chuck to the gas flow passageway contained in the pedestal of the electrostatic chuck.

Since the presence of groove or depression 304 in the surface of pedestal 204 results in electrostatic chuck 102 having a surface which is not be acceptably flat and the process for applying dielectric layer 214 is controllable only within a few mils, it is necessary to process dielectric layer 114 (typically by polishing or other ablative technique) to a flat surface as shown in FIG. 3D. Subsequent to processing of dielectric layer 114, passageway 202 having a thickness of $t_1$ through dielectric layer 114 and a thickness of $t_2$ through thin metallic layer 118 is created. Since thickness $t_1$ is substantially greater than it would have been without the presence of groove or depression 304, the conductive metal from layer 118 which travels up the sidewall of pathway 202 through dielectric layer 114 is confined to the lower portion 305 of the passageway 202, providing an additional thickness of dielectric layer 114 above any such metal present on the lower portion 305 of passageway 202.

Figure 3F:
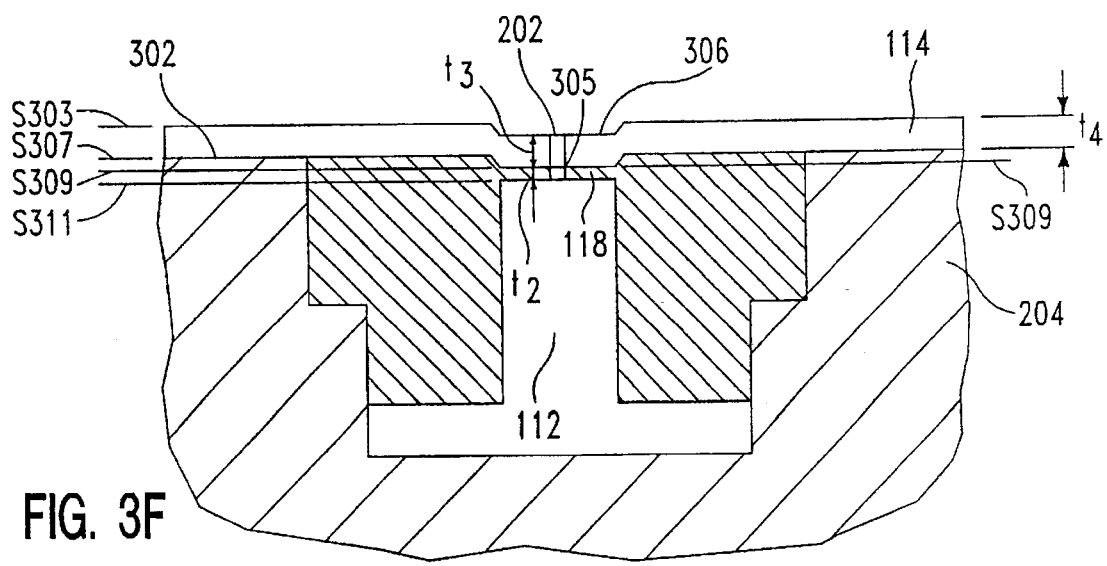
FIG. 3F shows the cross-sectional view shown in FIG. 3E after creation of a shallow channel in the surface of the dielectric layer overlying the gas flow passageway through that dielectric layer.

An optional addition to the structure of the present invention is the creation of a shallow channel 306 in the upper surface of dielectric layer 114 overlying passageway 202 as shown in FIG. 3F. This shallow channel is typically created using an excimer laser and has been shown to assist in the removal of metal originating from layer 118 which has climbed up the sidewall of passageway 202 onto the lower portion 305 of dielectric layer 114 which makes up the upper portion $t_3$ of passageway 202.

Figure 4:
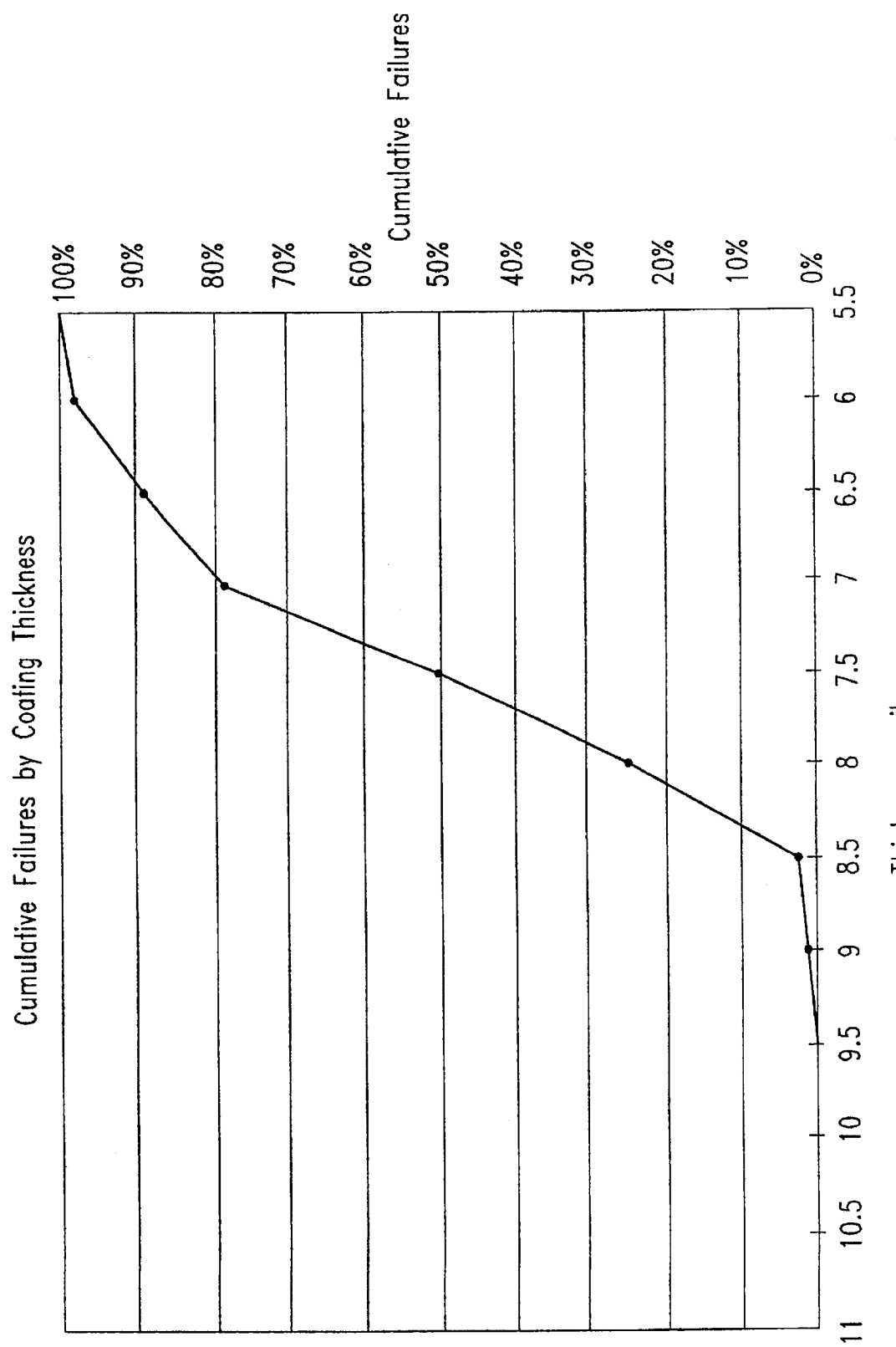
FIG. 4 is a graph illustrating the relationship between the thickness of the dielectric layer in the area of the gas flow passageway and cumulative failures during bench scale testing of the gas flow opening. The data is arranged from thickest toward thinnest coating to illustrate the dramatic improvement for dielectric layer thicknesses over 0.008 inches (8 mils, 0.20 mm).

A study of the cumulative failures of electrostatic chucks comprising the structure of the present invention, as a function of the thickness of layer $t_3$ was carried out. FIG. 4 shows the cumulative failures as a function of the thickness $t_1$ or $t_3$ with the data arranged from the thickest coating toward the thinnest coating. An unexpected increase in cumulative failures occurs when $t_1$ or $t_3$ is less than about 8 to 8.5 mils (0.20 mm to 0.216 mm). At a $t_1$ of about 5.5 mils (0.14 mm) or less, the cumulative failure reaches 100%. Thus, the thickness of the dielectric layer ($t_1$ or $t_3$) overlying the conductive layer 118 is preferably greater than 5 mils (0.13 mm), and in view of the data illustrated in FIG. 4, more preferably, the thickness of the dielectric layer is at least 8 mils (0.23 mm).

The study was done on a bench scale using a method which has been found to accurately predict failures in a plasma operational environment. A high voltage probe in the form of a flat piece of brass was placed across the gas flow opening and a test voltage of 500 V was applied to the probe. (The other electrode was the electrostatic chuck pedestal). A failure was considered to have occurred if an arc between the probe and the pedestal was detected. More than 600 gas flow openings 202 were tested.

This data was for a 6 inch (150 mm) diameter electrostatic chuck of the kind illustrated in FIGS. 2 and 3. The thickness $t_2$ of thin metal layer 118 was about 20 mils after the machining of groove 304. Shallow annular groove 304 was machined to a depth ranging from about 0.005 inches (5 mils, 0.13 mm) to about 0.009 inches (9 mils, 0.23 mm).

A dielectric layer 114 of 99.5% by weight alumina was plasma sprayed over surface 302 of pedestal 204. (Although this test was performed upon an electrostatic chuck having an alumina dielectric layer, dielectric layers comprised of alumina and titanium dioxide have shown improved reliability in operation. Typically the titanium dioxide content ranges from about 0.5% to about 5.0% by weight; preferably the titanium dioxide content is about 2% by weight.) The method of plasma spray application of alumina is known in the art. A critical variable is the absence of inclusions in the dielectric material such as bits of metal which can cause obvious problems. The dielectric layer 114 formed was a conformal coating over surface 302 of pedestal 204. Typically the coating was applied about 10 mils (0.010 inches, 0.25 mm) thicker than desired, and ground back to the desired thickness using ceramic grinding methods and equipment known in the art. The thickness $t_1$ of dielectric layer 114 was then approximately 11–13 mils (0.011–0.013 inches, 0.28 mm–0.50 mm) overlying shallow groove 304, with dielectric layer 114 thickness overlying surface 302 of pedestal 204 ranging from about 4–8 mils (0.004–0.008 inches, 0.10 mm–0.20 mm). The surface was flat to the 0.001 inch flatness, as previously defined.

Approximately 180 evenly-spaced gas passageways (holes) 202 were then created through $t_1$ and $t_2$ along annular insert 110, such passageways connecting to gas flow channel 112. The electrostatic chuck bench scale tested as previously described.

The bench testing has been found to correlate accurately with operation of an electrostatic chuck under high density plasma operational conditions. High density plasma (meaning greater than $10^{11}$ cm$^{-3}$ density) has proven to be much more challenging for electrostatic chuck operation than traditional capacitive RIE machine plasmas. It is a combination of the very low plasma impedance and the very small sheath thicknesses in these plasma that allow easy plasma penetration into small (sub-mm) features and then the support for high rf currents once arcing occurs.

The applied rf bias power affects arcing probability substantially. By using the structure and method of the present invention to reduce arcing, it was possible to increase rf power from about 1400 W to over 3 KW without arcing. Typically the plasma is SiH$_4$/O$_2$ at a few m Torr, but Ar/O$_2$ plasmas behave similarly with regard to arcing. The work piece is typically a silicon wafer, the temperature of which is not critical and may be anywhere from room temperature to about 400° C. The cooling gas is He at about 4 Torr (essentially static—there is a leak less than about 1 sccm, but this is not a factor in arcing). Because of the low breakdown voltage, He is particularly troublesome as a cooling gas. However, the thermal conductivity of He is the best among gases with the exception of H, which is flammable and can interfere with plasma chemistries. High voltage DC is typically either −1200 V or +800 V. It appears the DC bias is about 300 V to 400 V (negative with respect to ground).

Positive high voltage DC gives slightly better chucking reliability and it is believed this has to do with the ease of field emission of electrons from aluminum vs. silicon, but this mechanism has yet to be substantiated.

The above described preferred embodiments are not intended to limit the scope of the present invention, as one skilled in the art can, in view of the present disclosure expand such embodiments to correspond with the subject matter of the invention claimed below.

We claim:

1. A structure useful in facilitating heat transfer fluid flow to the upper surface of an electrostatic chuck, the structure comprising:
    (a) a conductive layer which contains at least one fluid flow passageway having at least one first opening to the upper surface of said conductive layer, wherein the distance between the upper surface of said conductive layer and the upper surface of said electrostatic chuck is greater in the area adjacent said at least one first opening than said distance in surrounding areas which are not adjacent said first opening; and
    (b) a dielectric layer overlying said conductive layer and having at least one second opening from the surface of said dielectric layer which connects with said first opening through said conductive layer, whereby a fluid flow path is provided from said passageway to the surface of said dielectric layer.

2. The structure of claim 1, wherein said conductive layer is an annular insert which fits within an annular cavity of a pedestal of said electrostatic chuck.

3. The structure of claim 1, wherein said conductive layer is selected from the group consisting of aluminum, copper, brass, molybdenum, and niobium.

4. The structure of claim 3, wherein said conductive layer is aluminum.

5. The structure of claim 1, wherein said dielectric layer is selected from the group consisting of ceramics and polyimides.

6. The structure of claim 5, wherein said ceramic is selected from 99.5% by weight alumina and mixtures of alumina with titanium dioxide.

7. The structure of claim 6, wherein the weight percentage of titanium dioxide in said alumina and titanium dioxide mixture ranges from about 0.5% to about 5.0%.

8. The structure of claim 1, wherein the thickness of said dielectric layer overlying said first opening is greater than 5 mils.

9. The structure of claim 8, wherein the thickness of said dielectric layer overlying said first opening is at least 8 mils.

10. The structure of claim 9, wherein the thickness of said dielectric layer overlying said first opening is less than about 50 mils.

11. The structure of claim 8, wherein the thickness of said conductive layer underlying said dielectric layer and adjacent said first opening is less than about 50 mils.

12. The structure of claim 11, wherein the thickness of said conductive layer underlying said dielectric layer and adjacent said first opening ranges from about 5 mils to about 50 mils.

13. The structure of claim 12, wherein the thickness of said conductive layer underlying said dielectric layer adjacent said first opening ranges from about 12 mils to about 25 mils.

14. A method of forming a structure useful in facilitating heat transfer fluid flow to the upper surface of an electrostatic chuck, the method comprising:
    (a) providing an electrostatic chuck pedestal including a conductive layer comprising at least one fluid flow passageway having at least one first opening to the upper surface of said conductive layer, wherein the distance between the upper surface of said conductive layer and the upper surface of said electrostatic chuck is greater in the area adjacent said first opening than said distance in surrounding areas which are not adjacent said first opening;

(b) applying a layer of dielectric material over at least a portion of said upper surface of said conductive layer, including said first opening; and (c) creating a second opening through at least said dielectric material overlying said first opening to connect said second opening with said fluid flow passageway in said conductive layer.

15. A method of forming a structure useful in facilitating heat transfer fluid flow to the upper surface of an electrostatic chuck, the method comprising:

(a) providing a conductive layer comprising at least one fluid flow passageway, wherein the thickness of said conductive layer overlying said passageway is less than the thickness of said conductive layer in surrounding areas which do not overlie said passageway;

(b) applying a layer of dielectric material over at least a portion of the surface of said conductive layer, including the portion of said conductive layer overlying said passageway; and (c) creating an opening through said dielectric material and said portion of said conductive layer overlying said passageway to connect with said fluid flow passageway.

16. The method of claim 15, wherein said thinner portion of said conductive layer is limited to the portion of said conductive layer immediately adjacent the location through which an opening is to be constructed to connect with said fluid flow passageway.

17. The method of claim 14, wherein said dielectric layer surface is not sufficiently flat after step (b), and processing is carried out of create a flat surface on said dielectric layer prior to carrying out step (c).

18. The method of claim 15, wherein said dielectric layer surface is not sufficiently flat after step (b), and processing is carried out of create a flat surface on said dielectric layer prior to carrying out step (c).

19. The method of claim 16, wherein said dielectric layer surface is not sufficiently flat after step (b), and processing is carried out of create a flat surface on said dielectric layer prior to carrying out step (c).

20. A structure useful in facilitating heat transfer fluid flow to the upper surface of an electrostatic chuck, said structure comprising: a conductive layer which contains at least one fluid flow passageway having at least one opening to the upper surface of said conductive layer, wherein the distance between the upper surface of said conductive layer and the upper surface of said electrostatic chuck is greater in the area adjacent said at least one opening than said distance in surrounding areas which are not adjacent said opening.

21. The structure of claim 20, wherein a dielectric layer overlies said upper surface of said conductive layer and wherein said dielectric layer includes at least one fluid flow passageway connecting with said at least one opening at the upper surface of said conductive layer, said dielectric layer passageway having at least one opening to the upper surface of said dielectric layer, wherein the distance between said upper surface of said conductive layer and said upper surface of said dielectric layer is greater in the area adjacent said at least one opening at said upper surface of said dielectric layer.

22. A method of reducing arcing between a substrate surface and an underlying electrostatic chuck surface or reducing arcing within an electrostatic chuck, said method comprising:

(a) providing a conductive layer which contains at least one fluid flow passageway having at least one opening to the upper surface of said conductive layer; and (b) constructing said conductive layer such that the distance between the upper surface of said conductive layer and the upper surface of said electrostatic chuck is greater in the area adjacent said at least one opening than said distance in surrounding areas which are not adjacent said opening.

23. A method of reducing arcing between a substrate surface and an underlying electrostatic chuck surface or reducing arcing within an electrostatic chuck, said method comprising:

(a) providing a conductive layer which contains at least one fluid flow passageway having at least one opening to the upper surface of said conductive layer;

(b) forming a dielectric layer overlying said upper surface of said conductive layer, wherein said dielectric layer includes at least one fluid flow passageway connecting with said at least one opening at the upper surface of said conductive layer, said dielectric layer passageway having at least one opening to the upper surface of said dielectric layer; and (c) constructing said conductive layer or said dielectric layer so that the distance between said upper surface of said conductive layer and said upper surface of said dielectric layer is greater in the area adjacent said at least one opening at said upper surface of said dielectric layer than said distance in surrounding areas which are not adjacent said opening.

* * * * *